May 16, 1967 F. W. ALLEN 3,320,555

ELECTRICAL DELAY LINE

Filed Dec. 7, 1962 2 Sheets-Sheet 1

INVENTOR.
FLOYD W. ALLEN
BY FOWLER & KNOBBE
ATTORNEYS

May 16, 1967 F. W. ALLEN 3,320,555

ELECTRICAL DELAY LINE

Filed Dec. 7, 1962 2 Sheets-Sheet 2

INVENTOR.
FLOYD W. ALLEN
BY FOWLER & KNOBBE
ATTORNEYS

United States Patent Office 3,320,555

Patented May 16, 1967

3,320,555

ELECTRICAL DELAY LINE

Floyd W. Allen, Fullerton, Calif., assignor to Beckman Instruments, Inc., a corporation of California Filed Dec. 7, 1962, Ser. No. 243,028
5 Claims. (Cl. 333—29)

The present invention relates to improvements in electrical delay lines and methods for making same, and in particular to improved distributed constant delay lines.

Electrical delay lines find wide usage in modern electronic systems and particularly those devices using pulsed information. Representative devices of this type are digital computers, telemetering systems, radar systems, and color television systems. Such delay lines include those termed electromagnetic delay lines, these lines being of two types, the lumped constant delay line and the distributed constant delay line. This invention relates to improvements in the latter type of electromagnetic delay line.

A distributed constant delay line comprises a distributed series inductance formed by an electrical coil and a distributed shunt capacitance provided by a ground plane in proximate capacitive relation to the coil. The electrical delay of this line is directly proportional to the product of the inductance and capacitance, and its characteristic impedance is equal to the square root of the quotient of the inductance and capacitance. In order to achieve a maximum time delay per unit volume of structure, high values for the inductance and capacitance are thus required. However, it has been difficult heretofore to maintain uniformity of high valued inductance and capacitance components along the length of the line when they have been compressed into a small volume. As a result, it has been difficult prior to this invention to construct long time delay, low volume devices having a uniform characteristic impedance along their length.

Another problem associated with the prior art devices is that they have not been adapted to techniques of mass production since it has been difficult ot determine the exact electrical delay of a unit during manufacture thereof. Still another disadvantage of many of the structures taught by the prior art is that they are physically long devices with a relatively small cross-sectional area (sometimes known as "stick" delay lines). This configuration does not readily lend itself to modern circuit packaging techniques, e.g. for mounting in conjunction with diodes, transistors and the like upon printed circuit boards.

These and other problems are illustrated by a representative prior art structure which comprises a cylindrical core having spaced conductive ground strip extending longitudinally thereon. A continuous length of insulated wire is wound upon the core to form a multi-layer coil. This coil, however, cannot be wound from one end to the other and back upon the core one or more times to provide the necessary inductance since the electrical signals would then be inductively coupled between different portions of the length of delay line. Instead, the multiturn coil must be formed by successive sequences along the length of core, each sequence including one or more turns formed with a forward pitch and one or more turns formed with a reverse pitch. This procedure obviates forming the device by a continuous strip procedure since each line must be formed as an individual unit. Also, it is very difficult to manufacture these devices to a predetermined electrical delay without actually measuring the delay during the manufacture thereof. Further, it is difficult to form the successive coil sequences such as to provide a uniform distributed inductance and capacitance throughout the length of delay line. And, the devices so formed have the physical configuration of a stick or elongated cylinder with the attendant disadvantages noted above.

Representative distributed constant electrical delay lines of the prior art are shown in U.S. Patents Nos. 2,452,-572—Jago; 2,467,857—Rubel et al.; 2,619,537—Kihn; 2,813,255—Williams et al.; and 2,916,711—Gillen.

An object of the present invention is to provide an improved electrical delay line and method for making same having a convenient shape such as a small, thin cylinder.

Another object of the present invention is to provide a compactly packaged electrical delay line having a very high time delay per unit volume and a uniform characteristic impedance value along the entire length of the delay line.

It is still another object of the present invention to provide a method for making delay lines wherein a plurality of delay lines having predetermined electrical delay values may be manufactured by a continuous strip manufacturing process.

Other and further objects, features and advantages of the invention will become apparent as the description proceeds.

Briefly, in accordance with a preferred form of the present invention, there is provided an electrical delay line comprising a relatively long flexible strip of magnetically permeable material having a substantially rectangular cross-section. A coil comprising a continuous length of conductor wire is helically wound upon this strip of permeable material to form a series inductance element. A ground plane member comprises closely spaced ribbons of a conductive material located between two strips of low-loss dielectric film. The series inductor element and ground plane member are positioned parallel and adjacent one another and wound into a plane bifilar spiral. The resultant delay line is preferably secured in a compact housing such as a thin cylindrical member having input and output terminals connected to the conductive ribbons.

The construction described above affords numerous advantages over the prior art devices. Thus, the coil is formed by a helical winding which is wound with a continuous forward pitch. Such a winding may be very accurately wound by well known abutting or space winding techniques. The ground plane member is also uniformly spaced from this winding along the length of the line thus affording a uniform characteristic impedance along the length of the delay line. The capacitance is large since the spiral configuration provides a ground plane on both sides of each convolution of the inductance winding.

Still additional advantages are that the delay line of the invention may be incorporated in a very compact package such as a thin cylindrical member. And, very long lengths of the series inductance and ground plane components may be formed by continuous strip manufacturing processes and then precut at predetermined lengths to obtain the desired time delay elements.

A more thorough understanding of the invention may be obtained by a study of the following and detailed description taken in connection with the accompanying drawings in which.

Figures 1, 2, 3, 4, 9:
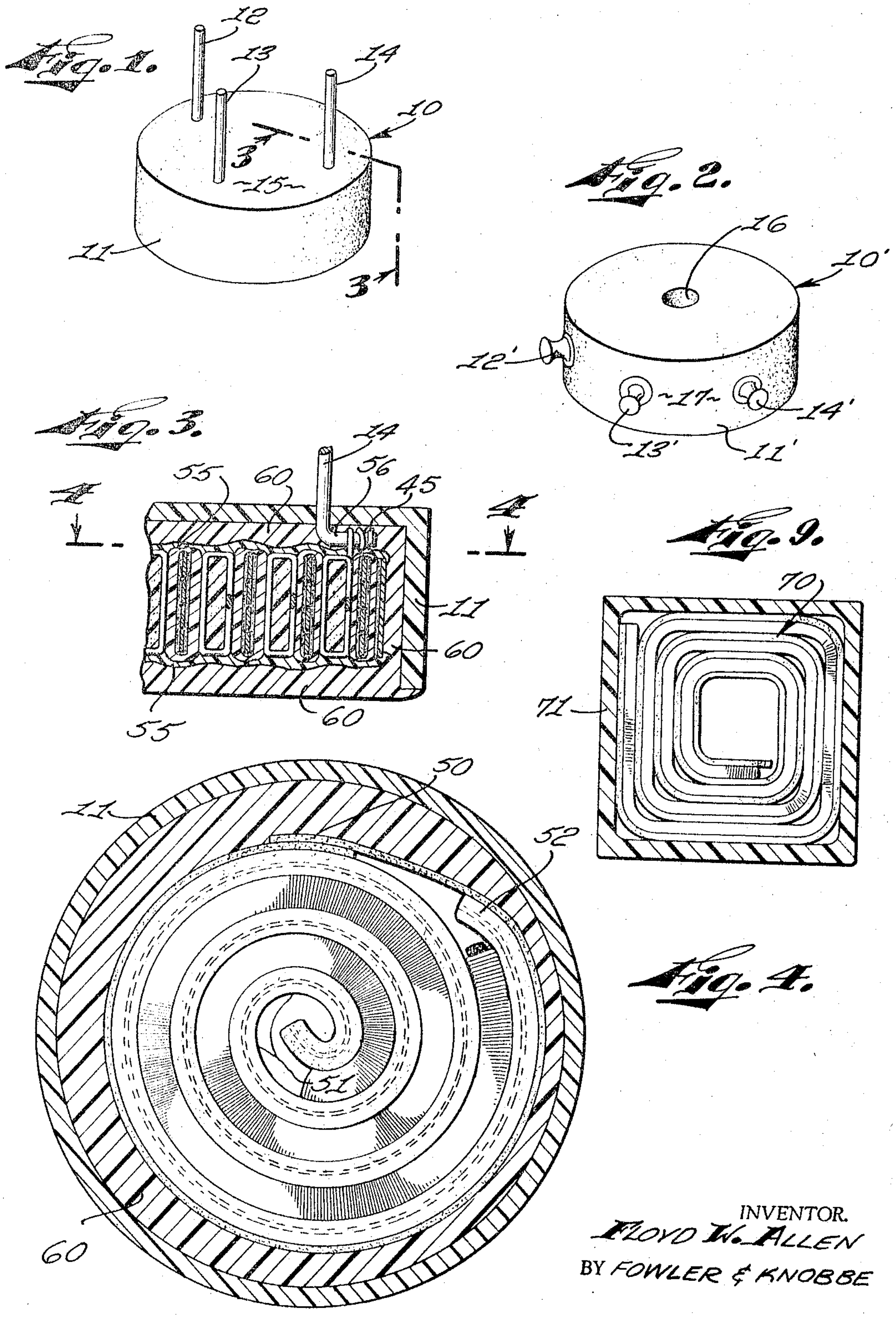
FIG. 1 is an isometric view of a completed electrical delay line having rigid pin terminals constructed in accordance with this invention.
FIG. 2 is an isometric view of another electrical delay line constructed in accordance with this invention, this line having solder lug terminals.
FIG. 3 is a fragmentary side elevation view partly in section taken along line 3—3 of FIG. 1.
FIG. 4 is a plan view in section taken along line 4—4 of FIG. 3.

It will be understood that each of the FIGURES 1–7 and 9 are somewhat enlarged in order to more clearly illustrate this invention. Representative dimensions for example of an electrical delay line having the configuration of FIGS. 1 and 2 are a diameter of 1⅛ inches and a thickness of ⅜ inch.

Referring now to FIGS. 1 and 2, there are shown electrical delay lines constructed in accordance with this invention. Electrical delay line 10 of FIG. 1 comprises a thin cylindrical housing 11 having rigid terminals 12, 13 and 14 extending outwardly from the planar surface 15. This structure is particularly adapted for mounting upon a printed circuit board. Another electrical delay line structure 10' shown in FIG. 2 comprises a thin cylindrical housing 11' having a mounting hole 16 extending through the axis of the cylinder. Solder lug terminals 12', 13' and 14' extend from the peripheral surface of the outer cylindrical wall 17.

Figure 8:
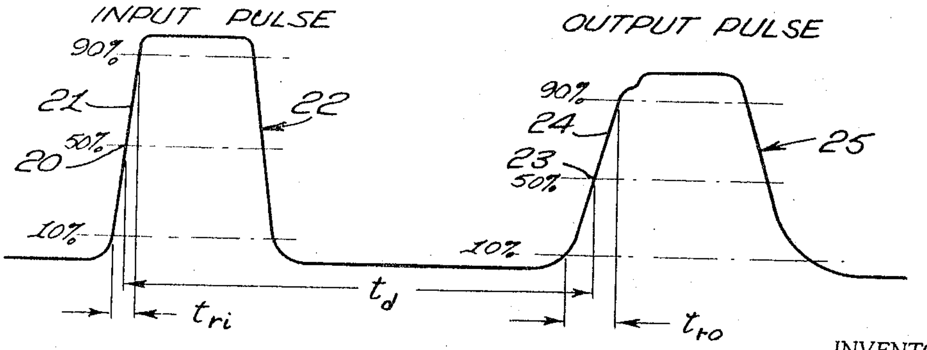
FIG. 8 illustrates an input pulse and an output pulse of a typical delay line to facilitate an understanding of the electrical characteristics thereof; and, FIG. 9 is a plan view in section of a generally rectangular embodiment of the invention.

The electrical characteristics of an electrical delay line are illustrated in FIG. 8. Pulses are shown since delay lines are widely used in conjunction therewith; such signals may be composed of frequencies from direct current to frequencies in excess of 35 megacycles. The input pulse shown would, for example, be applied between input terminal 13 and ground terminal 12 of delay line 10 and the output pulse would be measured between output terminal 14 and ground terminal 12 of the delay line 10.

The total delay time $t_d$ is measured from the 50% amplitude point 20 of the leading edge 21 of the input pulse 22 to the 50% amplitude point 23 of the leading edge 24 of the output pulse 25. The input pulse rise time $t_{ri}$ and output pulse rise time $t_{ro}$ are respectively measured between the 10% and 90% amplitude points. The network pulse rise time $t_r$ is defined by the equation $$t_r=\sqrt{(t_{ro})^2-(t_{ri})^2} \quad (1)$$

and the characteristic impedance $Z_o$ is defined by the equation $$Z_o=\sqrt{\frac{L}{C}} \quad (2)$$

where L is the value of total distributed series inductance and C is the value of total shunt capacitance between the coil and the ground plane. The figure of merit of the delay line is the ratio of the total delay $t_d$ to the delay line rise time $t_r$ or $$\text{Figure of Merit}=\frac{t_d}{t_r} \quad (3)$$

Representative delay lines of the invention have quite high figures of merit in the order of 10 to over 15 and total delay values of 10 to 300 nanoseconds ($10^{-9}$ seconds).

Figure 7:
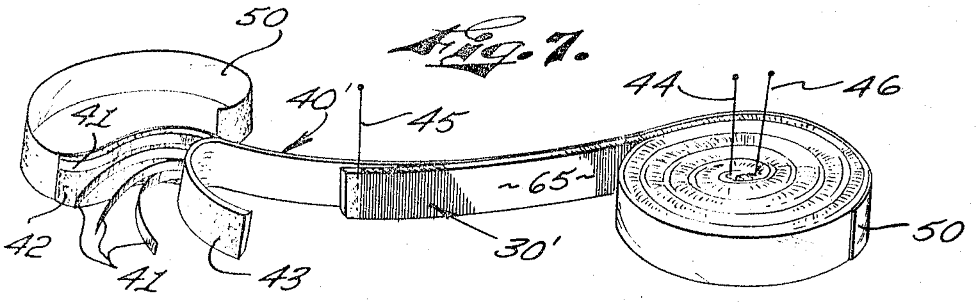
FIGS. 5, 6 and 7 illustrate the formation of an electrical delay line in accordance with the invention.
Figures 5, 6:
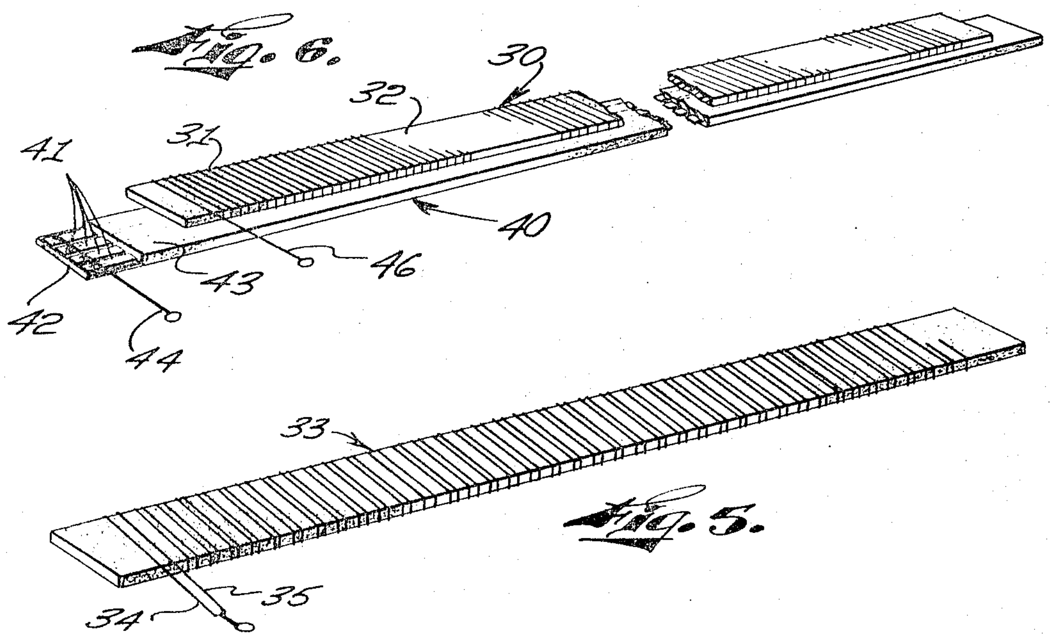

The method of constructing the electrical delay line of the invention is illustrated in FIGS. 5, 6 and 7. Referring now to FIG. 6, the series inductance component 30 is fabricated by winding a continuous wire 31 of low ohmic resistance. Copper is a preferable material for this wire. This wire may be uncoated if space wound in the manner shown or coated with a dielectric material such as polyvinyl formal synthetic enamel if wound with the turns abutting one another. The wire 30 is helically wound with a predetermined pitch about a rectangular mandrel 32 formed of a magnetically permeable material. This mandrel has preferably a rectangular cross-section and is formed of a flexible material having sufficient rigidity to support the helical winding during fabrication and subsequent processing. The electrical characteristics of the mandrel preferably include a low dissipation factor at high frequencies, high volume resistivity, and low hysteresis and eddy current loss. One example of such a material is polytetrafluoroethylene resin impregnated with powdered iron and manufactured by the Polymer Corporation, Reading, Pa.

An alternative method of construction shown in FIG. 5 provides the inductance element 33 formed by winding two or more continuous wires, e.g. wires 34, 35 on mandrel 31 in a manner such that an equal spacing is maintained between each wire of the set and between the succeeding turns of the set. Input and output ends of each wire are connected to their counterpart and create essentially multiple inductors in parallel. In the described configuration, the inductance element provides a lesser magnitude of inductance per unit length and allows construction of a lower characteristic impedance delay line than when using the single wire winding 31 of FIG. 6.

An advantage of both embodiments 30, 33 of the inductance element is that phase compensation may be readily accomplished by selecting a predetermined pitch for the coil winding. The helically wound coiled wire possesses a given value of series capacitance from turn-to-turn depending upon the winding. A given value of series capacitance accomplishes phase compensation and provides nearly equal delay to all frequencies within the pass band of the delay line.

The distributed shunt capacitance element is provided by the ground plane member 40 shown in detail in FIGS. 6 and 7. This member is constructed by placing at least one, but preferably several conductive elements, such as the four thin metallic ribbons 41, between two layers of low-loss dielectric film 42, 43. These ribbons are preferably formed of copper and the dielectric film may be constructed from, for example, polytetrafluoroethylene or a polyethylene terephthalate. A pressure sensitive adhesive is preferably applied to one side of each juxtaposed film layer to provide adherence to the metallic ribbons during fabrication of the ground plane, and in subsequent assembly operations. The spacing of these parallel metallic ribbons with respect to one another is such that the ribbons are not physically or electrically in contact; however, a minimum spacing is desired for reasons of providing maximum shunt capacitance. Electrical contact with the ground plane is generally made at one end thereof by electrically connecting a lead 44 to each of the ribbon members.

The electrical delay line is formed as shown in FIG. 7 by cutting an inductance element 30' to a length proportional to the delay time desired. It will generally be desired to allow a sufficient additional length for this element so that portions of the wire 31 may be unwound at both ends to form input and output leads 45, 46. Alternatively, one or more taps (not shown) may be affixed to the coil 31 either during or after winding thereof. These taps may be used as the end connections to each inductance element 30' and may also be included intermediate the end connections for allowing different values of delay for a single unit. A distributed shunt capacitive element 30' is cut somewhat longer than the inductance element and the two elements positioned parallel one another and wound into a plane bifilar spiral structure defined by the locus of the extremity of a radius vector which increases in length as it revolves about a fixed point. As shown, the longer sides of the cross-sections of both the inductance and the capacitive elements lie generally parallel to the axis of the spiral. The completed bifilar spiral is confined in this shape by a tape 50 encompassing the outer peripheral surface thereof (FIGS. 4 and 7). This tape may for example comprise a polyethylene terephthalate adhesive coated member. As shown in FIG. 4, the capacitive element 40' is cut sufficiently longer than the inductance element 30' to provide an inside turn 51 and an outside turn 52 (see FIGURE 4) overlapping respective ends of the inductive element when wound into the spiral configuration shown.

The electrical delay line construction further preferably includes dispersing a low-loss cement or encapsulent 55 (see FIG. 3), such as polystyrene or polyvinyl chloride, over the entire surface of the spiral unit for sealing same against absorption of any electrically lossy material. The spiralled and impregnated element is then inserted into the housing 11 and the inductance wire leads 45, 46 connected to the respective terminals 13, 14 and the ground plane lead 44 connected to a ground terminal 12. The connection of these leads to their respective terminals is exemplified by the connection of lead 45 to terminal 14 as shown in detail in FIG. 3 wherein lead 45 is twisted around the inner mounted portion 56 of terminal 14 and retained by welding, soldering, conductive cements or the like.

The delay line is completed by securing the spiral element within case 11 by a potting material 60, such as filled or unfilled epoxy, or other suitable thermoplastic or thermo-setting plastic compounds.

Electrical delay lines constructed in the same manner described above have several important advantages. Thus, their structural configuration insures a large shunt capacitance by locating a ground plane member on both sides of each convolution of the series conductance element. This structure, moreover, is provided by a single shunt capacitance element 40′ wherein the convolution of the bifilar spiral positioning the inductance element adjacent the preceding capacitive element (e.g. convolution 65 of FIG. 7) completes the capacitance to both sides of the series conductive element. Also, the structure provides an effective magnetic shielding between the preceding and succeeding convolutions of the inductance element.

Another significant feature of the invention is that the magnitude of the shunt capacitance per unit length may be readily varied by changing either the thickness of dielectric constant of the films 42, 43 or by varying the number and spacing of the metallic ribbons 41 forming the ground plane.

Furthermore, the construction of the present invention is readily adapted to continuous strip manufacturing techniques since very long lengths of the conductance element 30 and capacitive element 40 may be formed and then cut apart at predetermined lengths to form a plurality of electrical delay line elements having preselected time delays. This construction is feasible since the pitch of the winding 31 may be controlled very accurately by known winding techniques. Other component variables may be confined to extremely minute variations since the materials used may be readily obtained to have extremely close physical tolerances, e.g. the thickness of the dielectric films 42, 43, the width and thickness of the conductive ribbons 41, and the like.

The physical dimensions and electrical characteristics of an electrical delay line unit constructed in the manner described above is given by way of example only. The dimensions of the series inductance element were 9″ x 3⁄16″ x .016″, and the pitch or distance between turns of the winding 31 was .010 inch. The thickness of the dielectric film forming the insulated ground plane was 7 mils and the dimensions of each of the copper ribbons 10″ x .040″ x .003″. The diameter of the spiralled and impregnated unit was 0.80 inch and the outer diameter of the housing 11 was 0.90 inch. The electrical characteristics of this unit were as follows:

$t_{ri}$=22 nanoseconds
$t_{ro}$=23 nanoseconds
$t_r$=6.70 nanoseconds
$t_d$=105 nanoseconds
Figure of merit=15.7
$Z_o$=468 ohms This figure of merit is quite high, representative prior art distributed constant lines not ordinarily exceeding a time delay to rise time ratio greater than 10:1.

Although exemplary embodiments of the invention have been disclosed and discussed, it will be understood that other embodiments may be constructed employing the teaching of this invention. Thus, although the generally circular spiral configuration shown (defined by a radius arm which increases in length) provides a very compact line, other spiral configurations may be utilized including for example the generally rectangular structure 70 retained in the rectangular housing 71 shown in FIG. 9. Still other changes, modifications and substitutions which may be made without departing from the spirit of the invention will be apparent to those skilled in the art.

I claim:

1. An electrical delay line comprising:
a thin cylindrical housing having input, output and ground terminals attached thereto;
a unit having a bifilar spiral configuration impregnated with an encapsulating material for sealing said unit against absorption of any electrically lossy material, said spiralled and impregnated unit being secured within said housing by a potting material, said unit including
a length of magnetically permeable material supporting a helical winding and
spaced conductive ribbons supported between films of dielectric material; and
means electrically connecting respective ends of said helical winding to said input and output terminals and said conductive ribbons to said ground terminal.

2. An electrical delay line comprising:
a distributed inductance element including
a flexible longitudinal strip of magnetically permeable material, and
a multiturn coil helically wound upon said longitudinal strip of magnetically permeable material; and
a ground plane member including
a plurality of flexible conductive ribbons disposed in spaced apart relationship in a single plane, and
a pair of dielectric films on opposite sides of said conductive ribbons supporting said ribbons in spaced relationship,
said distributed inductance element and said ground plane member being wound together in a plane bifilar spiral configuration with each convolution of said series inductance element substantially between adjacent convolutions of said ground plane member so that the conductive ribbons of said ground plane member and the portions of the helical winding of said inductance element disposed on opposite sides of said strip of magnetically permeable material form an electrical capacitance when an electrical current is applied to said helical winding; and
input and output terminals connected to opposite ends of said helical winding and a ground terminal connecting said conductive ribbons to ground.

3. The electrical delay line defined in claim 2 wherein: said ground plane is longer by at least an amount equal to the outer circumference of said bifilar spiral configuration so that both sides of said inductance element are overlapped along the entire length thereof by said ground plane member.

4. The electrical delay line defined in claim 2 wherein: said multiturn coil comprises two or more continuous wires such that an equal spacing is maintained between each wire of the set and between the succeeding turns of the set.

5. An electrical delay line comprising:
an input terminal,
an output terminal,
a ground terminal, a distributed inductance comprising a member of magnetically permeable material formed into a plane spiral and a coil comprising a length of conductive wire helically wound upon said member of magnetically permeable material and having its ends respectively connected to said input and output terminals, and a distributed capacitance including an insulated conductive member connected to said ground terminal and formed into a plane spiral with adjacent convolutions thereof being disposed on opposite sides of said convolutions of said plane spiral of said member of magnetically permeable material so that said conductive member and the portions of said helical coil on opposite sides of said magnetically permeable member are in capacitive relation throughout the length of said coil.

References Cited by the Examiner

UNITED STATES PATENTS

| | | | |
|---|---|---|---|
| 1,984,526 | 12/1934 | Given | 123—148 |
| 2,512,945 | 6/1950 | Kallman | 333—30 |
| 2,619,537 | 11/1952 | Kihn | 333—31 |
| 2,650,350 | 8/1953 | Heath | 333—95 |
| 2,838,735 | 6/1958 | Davis | 333—31 |
| 2,911,598 | 11/1959 | Clemensen | 333—29 |
| 2,943,277 | 6/1960 | Lewis | 333—31 |
| 3,141,145 | 7/1964 | Barrett | 333—79 |
| 3,173,111 | 3/1965 | Kallman | 333—29 |
| 3,191,132 | 6/1965 | Mayer | 333—79 |

FOREIGN PATENTS

| | | |
|---|---|---|
| 793,793 | 4/1958 | Great Britain. |

HERMAN KARL SAALBACH, *Primary Examiner.*

C. BARAFF, *Assistant Examiner.*